(12) United States Patent
Kiyose

(10) Patent No.: US 11,322,371 B2
(45) Date of Patent: May 3, 2022

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventor: Hiromi Kiyose, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 24 days.

(21) Appl. No.: 16/182,711

(22) Filed: Nov. 7, 2018

(65) Prior Publication Data

US 2019/0139791 A1 May 9, 2019

(30) Foreign Application Priority Data

Nov. 9, 2017 (JP) .............................. JP2017-216482

(51) Int. Cl.
| | |
|---|---|
| *H01L 21/67* | (2006.01) |
| *H01L 21/677* | (2006.01) |
| *H01L 21/02* | (2006.01) |
| *B08B 3/10* | (2006.01) |

(52) U.S. Cl.
CPC .......... *H01L 21/67034* (2013.01); *B08B 3/10* (2013.01); *H01L 21/02057* (2013.01); *H01L 21/02101* (2013.01); *H01L 21/67051* (2013.01); *H01L 21/67173* (2013.01); *H01L 21/67178* (2013.01); *H01L 21/67253* (2013.01); *H01L 21/67742* (2013.01)

(58) Field of Classification Search
None
See application file for complete search history.

(56) References Cited

U.S. PATENT DOCUMENTS

| | | | |
|---|---|---|---|
| 2005/0113017 A1* | 5/2005 | Kim ................... | H01L 21/67253 454/187 |
| 2012/0227768 A1* | 9/2012 | Morita .............. | H01L 21/67051 134/18 |
| 2017/0256397 A1* | 9/2017 | Goshi ............... | H01L 21/67028 |

FOREIGN PATENT DOCUMENTS

| | | |
|---|---|---|
| JP | 2013-012538 A | 1/2013 |
| JP | 2017-175049 A | 9/2017 |

* cited by examiner

*Primary Examiner* — Mikhail Kornakov
*Assistant Examiner* — Pradhuman Parihar
(74) *Attorney, Agent, or Firm* — Pearne & Gordon LLP

(57) ABSTRACT

A substrate processing apparatus includes a liquid film forming unit 16A configured to form a liquid film of a liquid for anti-drying on a substrate; a drying processing unit 16B configured to dry the substrate; and a transfer mechanism 17 configured to transfer the substrate from the liquid film forming unit into the drying processing unit. By a transfer time adjusting operation of adjusting a volatilization amount of the liquid during a transfer of the substrate by adjusting a transfer time during which the substrate is transferred from the liquid film forming unit into the drying processing unit or by an initial liquid film thickness adjusting operation of adjusting a thickness of the liquid film formed in the liquid film forming unit, the thickness of the liquid film when a drying processing is begun in the drying processing unit is controlled to fall within a target range.

6 Claims, 4 Drawing Sheets

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-216482 filed on Nov. 9, 2017, the entire disclosure of which is incorporated herein by reference.

TECHNICAL FIELD

The various aspects and embodiments described herein pertain generally to a technique of allowing a thickness of a liquid film of a protection liquid on a surface of a substrate such as semiconductor wafer to be maintained within an appropriate range when the substrate is carried in a drying processing unit configured to perform a drying processing such as a supercritical drying processing on the substrate.

BACKGROUND

In the manufacture of a semiconductor device, a liquid processing such as chemical liquid cleaning or wet etching is performed on a substrate such as a semiconductor wafer. As a pattern formed on a surface of the substrate is miniaturized with a high aspect ratio, a collapse of the pattern may easily occur in a drying process of removing a liquid remaining on the surface of the substrate. To cope with this problem, a drying method using a processing fluid in a supercritical state (for example, supercritical $CO_2$) has been recently performed (see, for example, Patent Document 1).

The liquid processing and the supercritical drying processing are performed in different processing units. An example flow of these processings will be briefly explained here. First, a chemical liquid processing, a pure water rinsing processing and a protection liquid replacement processing are performed in sequence within a liquid processing unit. As the protection liquid, IPA (Isopropyl Alcohol) may be used, for example. Then, the substrate, in which a liquid film (paddle) of the protection liquid is formed on the entire surface thereof, is transferred from the liquid processing unit into a supercritical drying processing unit, and the supercritical drying processing is performed on the substrate within the supercritical drying processing unit.

If the liquid film of the protection liquid within a recess of the pattern on the surface of the substrate disappears by volatilization thereof in a period after the liquid film of the protection liquid is formed on the substrate within the liquid processing unit until the protection liquid is replaced by the supercritical fluid within the supercritical drying processing unit, the collapse of the pattern may occur. For this reason, a liquid film of the protection liquid having an enough thickness to suppress the liquid film from disappearing during the aforementioned period needs to be formed in the liquid processing unit. If, however, the liquid film has an excessively large thickness, a particle level on the surface of the substrate is deteriorated after the supercritical drying processing.

Thus, the thickness of the liquid film of the protection liquid to be formed on the surface of the substrate needs to be within an appropriate range. The present inventor has operated a substrate processing apparatus incorporating a plurality of liquid processing units and a plurality of supercritical drying processing units and found out that it is difficult to maintain the thickness of the liquid film of the protection liquid within the appropriate range at a time when a supply of the supercritical fluid is begun within the supercritical drying processing unit.

Patent Document 1: Japanese Patent Laid-open Publication No. 2013-012538

SUMMARY

In view of the foregoing, exemplary embodiments provide a technique capable of allowing a thickness of a liquid film of a protection liquid on a surface of a substrate to be maintained within an appropriate range when the substrate is carried into a drying processing unit.

In one exemplary embodiment, a substrate processing apparatus comprises at least one liquid film forming unit configured to form a liquid film of a protection liquid on a surface of a substrate; at least one drying processing unit configured to accommodate therein the substrate on which the liquid film is formed to dry the substrate; a transfer mechanism configured to take out the substrate on which the liquid film is formed from the at least one liquid film forming unit and transfer the taken substrate into the at least one drying processing unit; and a control device configured to control a thickness of the liquid film on the surface of the substrate at a moment when a drying processing is begun in the at least one drying processing unit to fall within a target range by performing a transfer time adjusting operation of adjusting a volatilization amount of a liquid forming the liquid film on the substrate during a transfer of the substrate by adjusting a transfer time during which the substrate is transferred from the at least one liquid film forming unit into the at least one drying processing unit with the transfer mechanism or by performing an initial liquid film thickness adjusting operation of adjusting the thickness of the liquid film formed on the substrate in the at least one liquid film forming unit.

In another exemplary embodiment, there is provided a substrate processing method performed in a substrate processing apparatus including at least one liquid film forming unit configured to form a liquid film of a protection liquid on a surface of a substrate; at least one drying processing unit configured to accommodate therein the substrate on which the liquid film is formed to dry the substrate; and a transfer mechanism configured to take out the substrate on which the liquid film is formed from the at least one liquid film forming unit and transfer the taken substrate into the at least one drying processing unit. The substrate processing method comprises forming the liquid film of the protection liquid on the surface of the substrate in the at least one liquid film forming unit; transferring the substrate from the at least one liquid film forming unit into the at least one drying processing unit by the transfer mechanism; drying the substrate in the at least one drying processing unit; and controlling a thickness of the liquid film on the surface of the substrate at a moment when a drying processing is begun in the at least one drying processing unit to fall within a target range, by performing a transfer time adjusting operation of adjusting a volatilization amount of a liquid forming the liquid film on the substrate during a transfer of the substrate by adjusting a transfer time during which the substrate is transferred from the at least one liquid film forming unit into the at least one drying processing unit with the transfer mechanism or by performing an initial liquid film thickness adjusting operation of adjusting the thickness of the liquid film formed on the substrate in the at least one liquid film forming unit.

In yet another exemplary embodiment, there is provided a computer-readable recording medium having stored thereon computer-executable instructions that, in response to execution, cause the substrate processing apparatus to perform the substrate processing method.

According to the exemplary embodiment as stated above, since the thickness of the liquid film on the surface of the substrate can be maintained within the target range until the drying processing in the drying processing unit is begun, the desirable processing result can be stably obtained for the substrates.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
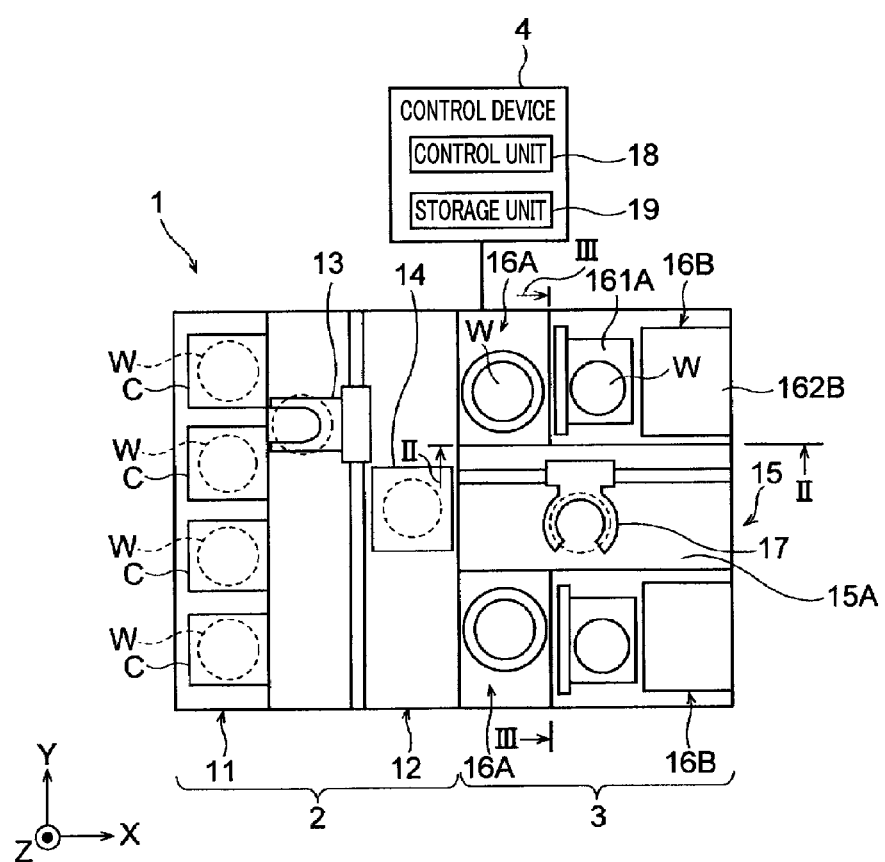
FIG. 1 is a schematic plan view illustrating an overall substrate processing system (substrate processing apparatus)

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

FIG. 1 is a plan view illustrating an outline of a substrate processing system according to an exemplary embodiment. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafer W between the carrier C and the delivery unit 14 by using the wafer holding mechanism.

The processing station 3 is provided adjacent to the transfer section 12. The processing station 3 is provided with a transfer section 15, a plurality of liquid processing units 16A and a plurality of supercritical drying processing units 16B.

Each of the liquid processing units 16A is configured to perform a preset liquid processing (a chemical liquid cleaning processing, a wet etching processing, or the like) on the substrate. By way of example, the liquid processing unit 16A is equipped with: a spin chuck 161A configured to hold the wafer W horizontally and rotate the wafer W around a vertical axis; and one or more nozzles 162A configured to supply a processing liquid (a chemical liquid, a rinse liquid, a protection liquid (e.g., IPA), or the like) onto the wafer W. The configuration of the liquid processing unit 16A is not limited thereto, and any of various configurations may be adopted as long as a liquid film of the protection liquid can be formed on a surface of the wafer W in a required thickness.

Each of the supercritical drying processing units 16B is configured to dry the wafer W by supplying a supercritical fluid (for example, supercritical $CO_2$) onto the wafer W on the surface of which the liquid film of the protection film for anti-drying is formed. By way of example, the supercritical drying processing unit 16B is equipped with: a tray 161B configured to hold the wafer W horizontally; and a processing chamber 162B configured to accommodate therein the tray 161B in a sealed state. The processing chamber 162B is equipped with: a nozzle (not shown) configured to supply the supercritical fluid into the processing chamber 162B; and a drain port (not shown) through which a fluid is drained from the processing chamber 162B. As the supercritical drying processing unit 16B, one disclosed in Japanese Patent Laid-open Publication No. 2013-012538 field by the present applicant may be used, but not limited thereto.

The transfer section 15 has a transfer space 15A extended in the X direction, and a substrate transfer device (transfer mechanism) 17 is provided in this transfer space 15A. The multiple (three in the shown example) liquid processing units 16A are stacked in a vertical direction (Z-direction) at a left side (positive Y-direction) of the transfer space 15A, and the multiple (three in the shown example) liquid processing units 16A are stacked at a right side (negative Y-direction) transfer space 15A to face the liquid processing units 16 at the left side in the Y-direction. The multiple (three in the shown example) supercritical drying processing units 16B are stacked in the vertical direction (Z-direction) at the left side (positive Y-direction) of the transfer space 15A and at the rear (positive X-direction) of the liquid processing units 16A. Further, the multiple (three in the shown example) supercritical drying processing units 16B are stacked at the right side (negative Y-direction) of the transfer space 15A and at the rear of the liquid processing units 16A (positive X-direction) to face the supercritical drying processing units 16B at the left side in the Y-direction.

The substrate transfer device 17 is equipped with a wafer holding mechanism configured to hold the wafer W. Further, the substrate transfer device 17 is configured to be movable horizontally and vertically and pivotable around a vertical axis. The wafer holding mechanism of the substrate transfer device 17 is accessible to the delivery unit 14, all the liquid processing units 16A and all the supercritical drying processing units 16B, and is configured to transfer the wafer W between these respective units 14, 16A and 16B.

The processing station 3 of the substrate processing system 1 includes a housing 3A. The liquid processing units 16A, the supercritical drying processing units 16B and the substrate transfer device 17 are accommodated in the housing 3A. Formed within the processing station 3 is the transfer space 15A which is surrounded by a ceiling plate and a bottom plate of the housing 3A and casings of the liquid processing units 16A and the supercritical drying processing units 16B. The wafer W is transferred in this transfer space 15A by the substrate transfer device 17.

A fan filter unit (FFU) 22 is provided on a ceiling of the housing 3A. The FFU 22 is provided to cover the substantially entire transfer space 15A from above. The FFU 22 is configured to supply a clean gas (in the present exemplary embodiment, clean air including air within a clean room which is filtered by a filter) downwards within the transfer space 15A. That is, a flow (downflow) of the clean air flowing downwards is formed within the transfer space 15A.

The substrate processing system 1 is equipped with a control device 4. The control device 4 is, for example, a computer, and includes a control unit 18 and a storage unit 19. The storage unit 19 stores programs which control various processings performed in the substrate processing system 1. The control unit 18 controls operations of the substrate processing system 1 by reading and executing the programs stored in the storage unit 19.

Further, the programs may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and then carried into the liquid processing unit 16A.

The wafer W carried into the liquid processing unit 16A is rotated around the vertical axis while being held horizontally by the spin chuck 161A. As a chemical liquid is supplied from the nozzle 162A onto a central portion of a surface of the wafer W being rotated, a chemical liquid processing is performed on the wafer W. Then, as a rinse liquid (e.g., pure water) is supplied from the nozzle 162A onto the central portion of the surface of the wafer W, a rinsing processing is performed on the wafer W. Thereafter, as a protection liquid (e.g., IPA) is supplied from the nozzle 162A onto the central portion of the surface of the wafer W, a replacement processing of replacing the rinse liquid existing on the surface of the wafer W (including an inside of a recess of a pattern formed on the surface of the wafer W) with the protection liquid is performed. Here, all of the chemical liquid, the rinse liquid and the protection liquid may be supplied from the single nozzle 162A or they may be supplied from different nozzles.

By adjusting a rotation number of the wafer W at an ending time of the replacement processing (including a time after stopping the discharge of the protection liquid), a thickness of the liquid film of the protection liquid (hereinafter, referred to as "protective film") formed on the surface of the wafer W can be adjusted.

The liquid processing performed by the liquid processing unit 16A is not particularly limited as long as the surface of the substrate is covered with the liquid film of the protection liquid through the final process of the corresponding liquid processing. By way of example, a dual-fluid cleaning processing may be performed without performing the chemical liquid processing prior to the rinsing processing, and the liquid processing performed in the liquid processing unit 16A may start from the rinsing processing.

Upon the completion of the replacement processing, the wafer W with the entire surface thereof covered with the liquid film of the protection liquid is carried out of the liquid processing unit 16A by the substrate transfer device 17, and is then carried into the supercritical drying processing unit 16B. In this carrying-in operation, the substrate transfer device 17 places the wafer W on the tray 161B taken out from the processing chamber 162B of the supercritical drying processing unit 16B. Thereafter, the tray 161B on which the wafer W is placed is accommodated in the processing chamber 162B, and the processing chamber 162B is airtightly sealed. Afterwards, a supercritical fluid (for example, $CO_2$ in a supercritical state) is introduced into the processing chamber 162B from one side of the processing chamber 162B, and a fluid within the processing chamber 162B is drained from the other side of the processing chamber 162B. Accordingly, the protection liquid (here, IPA) on the surface of the wafer W (including the inside of the recess of the pattern formed on the surface of the wafer W) is replaced by the supercritical fluid. Then, by reducing a pressure within the processing chamber 162B to an atmospheric pressure, the supercritical fluid is turned into a gas state, so that the surface of the wafer W can be dried without causing the pattern collapse.

Desirably, the protection liquid is a liquid which satisfies following conditions.

The protection liquid on the surface of the wafer W (including the inside of the recess of the pattern formed on the surface of the wafer W) is easily replaced by the supercritical fluid supplied onto the wafer W in the supercritical drying processing unit 16B.

The protection liquid is difficult to disappear easily by the volatilization thereof while the wafer W is being transferred from the liquid processing unit 16A into the supercritical drying processing unit 16B (if the pattern of the wafer W is exposed before the protection liquid is replaced by the supercritical fluid, the pattern may collapse due to a surface tension of the protection liquid).

In case that a process performed before supplying the protection liquid is the rinsing process, the rinse liquid (e.g., pure water) on the surface of the wafer W (including the inside of the recess of the pattern formed on the surface of the wafer W) needs to be easily replaced by the protection liquid.

In the present exemplary embodiment, though the IPA (Isopropyl Alcohol) is used as the protection liquid which satisfies all the above-mentioned conditions, the protection liquid is not particularly limited thereto as long as it meets the aforementioned conditions and does not have an adverse influence upon the wafer W.

Upon the completion of the supercritical drying processing, the tray 161B holding the wafer W is taken out from the processing chamber 162B, and the substrate transfer device 17 takes out the wafer W from the tray 161B and transfers the wafer W to the delivery unit 14. The processed wafer W placed on the delivery unit 14 is then returned back into the carrier C in the placing section 11 by the substrate transfer device 13.

In the above-described exemplary embodiment, the wafer W taken out from a certain liquid processing unit 16A is carried into a supercritical drying processing unit 16B which is located at the same level and at the same side (with respect to the Y-direction) as the corresponding certain liquid processing unit 16A. Since an upper transfer path through which the wafer W is transferred from the liquid processing unit 16A at an upper level into the supercritical drying processing unit 16B at the upper level is closest to the FFU 22, a flow velocity of the clean air flowing in this transfer path is highest. The flow velocity of the clean air in an intermediate transfer path from the liquid processing unit 16A at an intermediate level to the supercritical drying processing unit 16B at the intermediate level is lower than the flow velocity in the upper transfer path, and the flow velocity of the clean air in a lower transfer path from the liquid processing unit 16A at a lower level to the supercritical drying processing unit 16B at the lower level is even lower than that. For the reason, the volatilization amount of the protection liquid on the surface of the wafer W is largest when the wafer W is transferred through the upper transfer path and is smallest when the wafer W is transferred through the lower transfer path.

In consideration of this, as a first method of allowing the thickness of the liquid film on the surface of the wafer W to be uniform at a time when beginning the supply of the supercritical fluid onto the wafer W in each supercritical drying processing unit 16B, the volatilization amount of the protection liquid during the transfer of the wafer W needs to be uniform. This uniformization of the volatilization amount of the protection liquid during the transfer of the wafer W can be accomplished by setting a time (transfer time) taken for the transfer of the wafer W from the liquid processing unit 16A into the supercritical drying processing unit 16B at each level such that a relationship of "the transfer time in the transfer at the upper level<the transfer time in the transfer at the intermediate level<the transfer time in the transfer at the upper level" is established. This relationship between the transfer times may be achieved by setting a condition of "a transfer speed in the transfer at the upper level>a transfer speed in the transfer at the intermediate level>a transfer speed in the transfer at the lower level." Instead of adjusting the transfer speed, the transfer speed at each level may be uniformed, and there may be provided a stop time during which a movement of the substrate is stopped in the transfer thereof and there may be established a relationship of "the stop time (may be zero) in the transfer at the upper level<the stop time in the transfer at the intermediate level<the stop time in the transfer at the lower level." Instead of adjusting the stop time, there may be provided a low-speed operation time during which the transfer speed of the substrate is greatly reduced during the transfer thereof, and there may be established a relationship of "the low-speed operation time (may be zero) in the transfer at the upper level<the low-speed operation time in the transfer at the intermediate level<the low-speed operation time in the transfer at the lower level." That is to say, the low-speed operation time during which the wafer W is transferred at a transfer speed lower than a typical transfer speed may be set within the transfer time, the transfer speed may be controlled such that the low-speed operation time when the wafer W is transferred through the transfer path at the lower side may be set to be longer.

A second method of allowing the thickness of the liquid film on the surface of the wafer W to be uniform at the time when beginning the supply of the supercritical fluid onto the wafer W in each supercritical drying processing unit 16B is based on the premise that there is a difference in the volatilization amount of the protection liquid per unit time in the transfer of the wafer W at each level. To offset this difference, the thickness of the liquid film (initial liquid film thickness) of the protection liquid formed in each liquid processing unit 16A is set such that a relationship of "the initial liquid film thickness in the transfer at the upper level>the initial liquid film thickness in the transfer at the intermediate level>the initial liquid film thickness in the transfer at the lower level" Is established.

The first method and the second method may be performed in combination with each other appropriately.

Conditions for the adjustment of the transfer time and/or the stop time in the first method and conditions for the adjustment of the initial liquid film thicknesses in the second method may be determined based on a result of a preliminary experiment. The preliminary experiment may be conducted by actually operating the processing station 3, that is, by transferring the wafer, on which protective film is formed on the surface thereof, through each transfer path and measuring the thickness of the protective film at a moment when the wafer W is placed on the tray 161B of the supercritical drying processing unit 16B. As a method of measuring the thickness of the liquid film on the surface of the wafer W, any of various commonly known methods, such as a method using a laser displacement meter, a method using an optical interference principle, and so forth, may be used.

Figure 4:
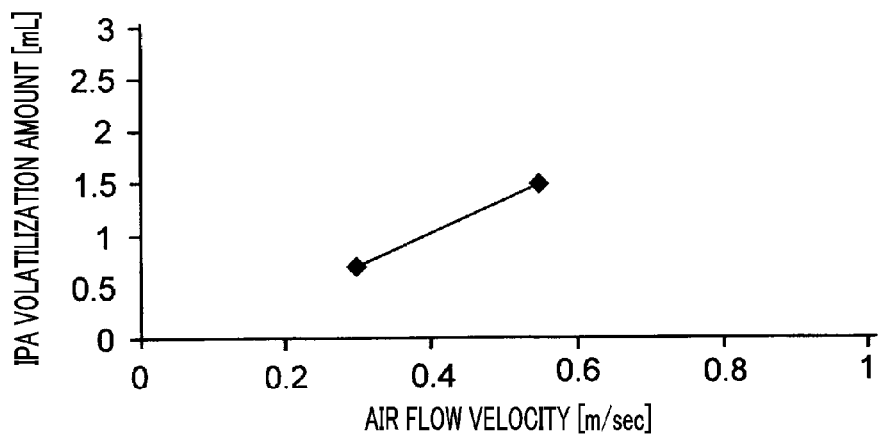
FIG. 4 is a graph showing a relationship between an air flow velocity and a volatilization amount of a protection liquid.
Figure 5:
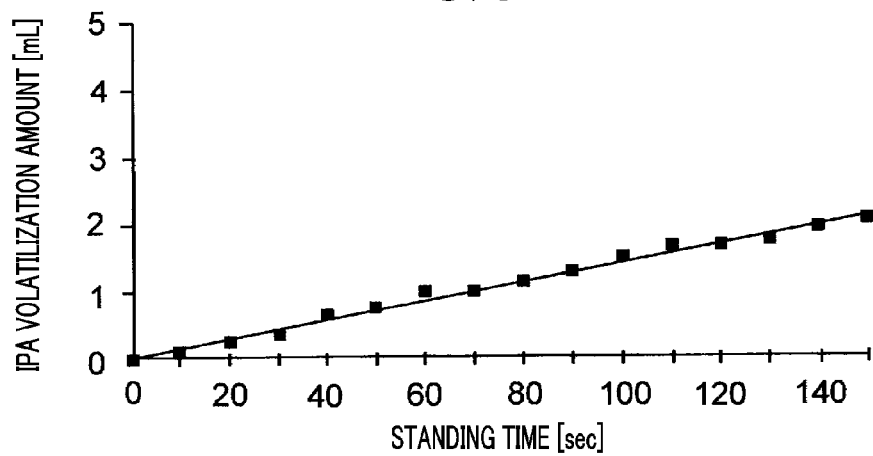
FIG. 5 is a graph showing a relationship between the volatilization amount of the protection liquid and an elapsed time when a wafer W is left standing.

As schematically depicted in graphs of FIG. 4 and FIG. 5, a relationship between the air flow velocity and the volatilization amount of the protection liquid (here, IPA), a relationship between the volatilization amount of the protection liquid and the elapsed time when the wafer W is left standing, and so forth can be easily investigated by experiments. Further, a flow velocity distribution of the clean air within the transfer space 15A can be easily used by an experiment or a simulation. By using these data, the conditions for the adjustment of the transfer time and/or the stop time in the first method and the conditions for the adjustment of the initial liquid film thicknesses in the second method may be decided through a computer simulation.

The aforementioned first method can be performed as the control device 4 controls the operation of the substrate transfer device 17. The above-stated second method can be performed as the control device 4 controls the operation of the liquid processing unit 16A. In performing any method, the control device 4 adjusts the transfer time and/or the initial liquid film thickness based on process recipes stored in the storage unit 19.

In an appropriate exemplary embodiment, a transfer path of each wafer W belonging to each processing lot is set in the process recipe, and it is also previously set how to perform the adjustment of the transfer time and/or the adjustment of the initial liquid film thickness on each corresponding wafer W.

The storage unit 19 of the control device 4 may have a database in which a relationship between each transfer path and the adjustment of the transfer time and/or the adjustment of the initial liquid film thickness to be performed therefor is recorded. In this case, based on this database, the control device 4 may decide the adjustment of the transfer time and/or the adjustment of the initial liquid film thickness to be performed on each wafer W.

According to the above-described exemplary embodiment, by adjusting the transfer time and/or the initial liquid film thickness, the thickness of the liquid film on the surface of the wafer W at the moment when the supply of the supercritical fluid onto the wafer W is begun in each supercritical drying processing unit 16B can be allowed to fall within an appropriate range. Therefore, an appropriate processing result (regarding the pattern collapse, the particle level, etc.) can be stably obtained.

Figure 2:
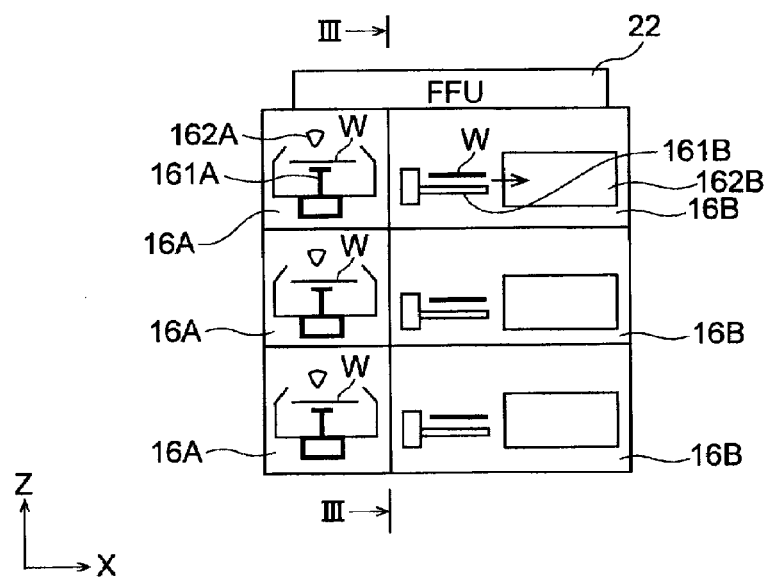
FIG. 2 is a schematic side view of a processing station of the substrate processing system of FIG. 1.
Figure 3:
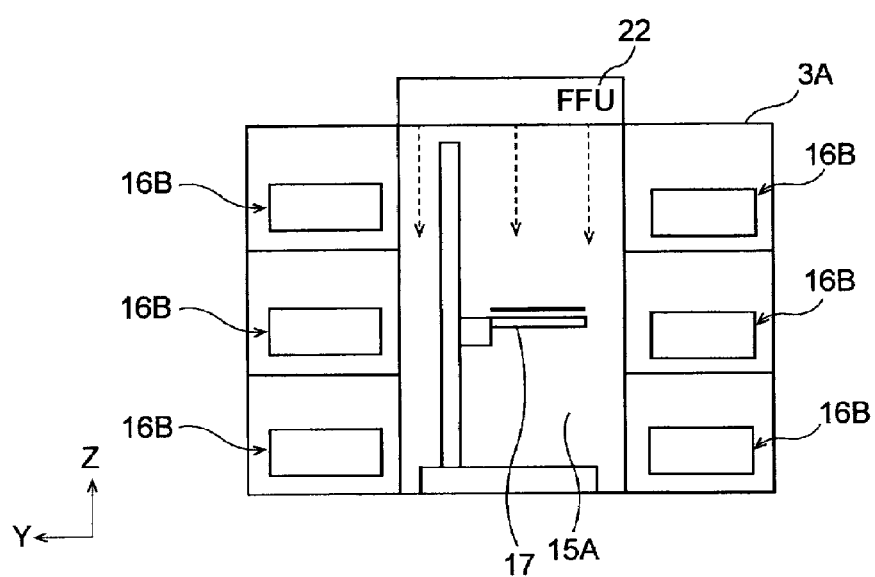
FIG. 3 is a schematic front view of the processing station of the substrate processing system of FIG. 1.
Figure 6A:
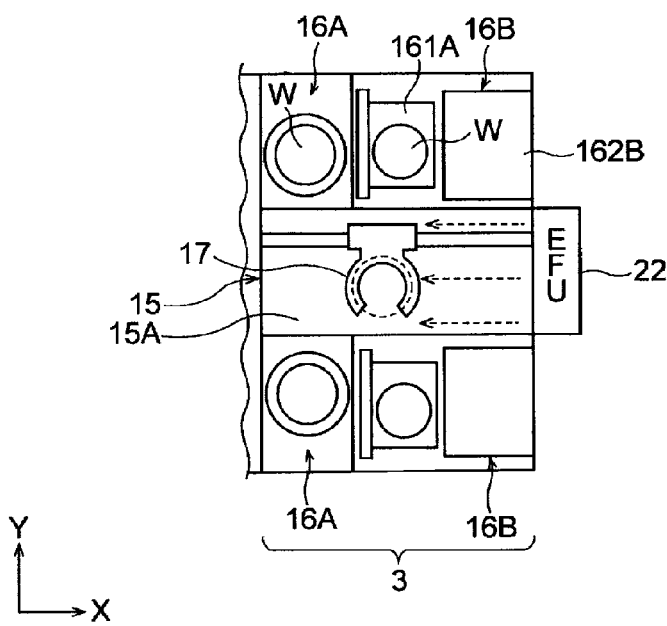
FIG. 6A is a schematic plan view illustrating a modification example in which a FFU is provided at a sidewall of the processing station, seen from the same viewpoint as FIG. 1.
Figure 6B:
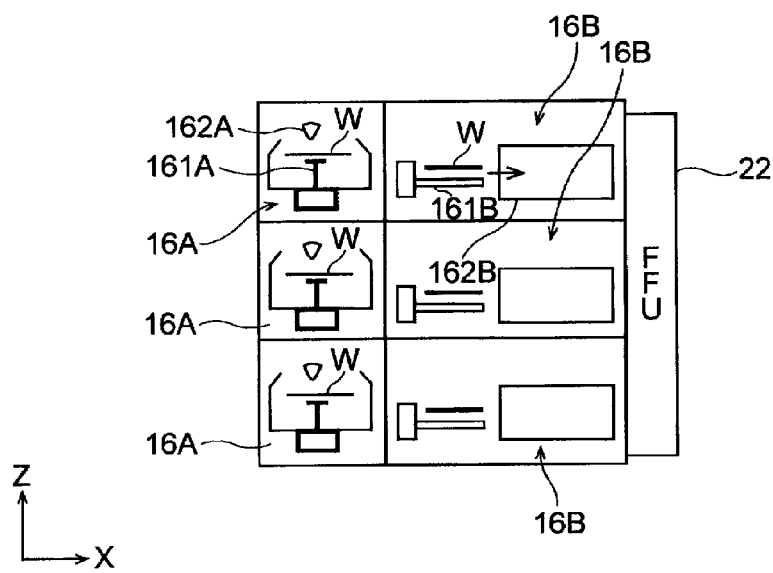
FIG. 6B is a schematic side view illustrating the modification example in which the FFU is provided at the sidewall of the processing station, seen from the same viewpoint as FIG. 2.

The configuration of the processing station 3 of the substrate processing system 1 may not be limited to the example shown in FIG. 1 to FIG. 3. By way of example, as schematically illustrated in FIG. 6A and FIG. 6B, the FFU 22 may be provided at a sidewall of the housing, and a sideflow may be formed within the transfer space 15A. In this case as well, the adjustment of the transfer time and/or the adjustment of the initial liquid film thickness may be performed based on the flow velocity distribution of the clean air flowing in the transfer path through which the wafer W is transferred from the liquid processing unit 16A to the supercritical drying processing unit 16B. The liquid processing units 16A and the supercritical processing units 16B may not be stacked in the multiple levels.

In the above-described exemplary embodiment, the substrate transfer device 17 transfers the wafer W between the liquid processing unit 16A and the supercritical drying processing unit 16B which are located at the same level and at the same side. However, the exemplary embodiment is not limited thereto. The wafer W may be transferred from the liquid processing unit 16A and the supercritical drying processing unit 16B which are located at different levels or at different sides. In this case as well, the adjustment of the transfer time and/or the adjustment of the initial liquid film thickness may be performed based on the flow velocity distribution of the clean air flowing in the transfer path through which the wafer W is transferred from the liquid processing unit 16A to the supercritical drying processing unit 16B.

Further, in the above-described exemplary embodiment, one liquid processing unit 16A previously selected from the plurality of liquid processing units 16A and one supercritical drying processing unit 16B previously selected from the plurality of supercritical drying processing units 16B form a preset pair, and the wafer W is transferred only between these processing units of each pair. However, the exemplary embodiment is not limited thereto. Whenever a new wafer W is carried into the processing station 3, the liquid processing unit 16A and the supercritical drying processing unit 16B to be used to process this new wafer W may be selected. When adopting this operation scheme, it may be desirable to previously decide the conditions for the adjustment of the transfer time and/or the adjustment of the initial liquid film thickness for all possible transfer paths.

In the above-described exemplary embodiment, though the multiple transfer paths are provided between the plurality liquid processing units 16A and the plurality of supercritical drying processing units 16B, the exemplary embodiment is not limited thereto. The wafers W may be transferred through a single transfer path from a single liquid processing unit 16A into a single supercritical drying processing unit 16B. In this case, since the wafers W are transferred through the same transfer path all the time, it may be deemed that the flow velocity of the gas (clean air) flowing through the transfer path is substantially same for all of the wafers W, and the thickness of the liquid film of the protection liquid on the surface of the wafer W at the moment when the wafer W is carried into the supercritical drying processing unit 16B may not become non-uniform due to an influence from the gas (for example, due to an influence from the clean air discharged from the FFU 22). However, there may be considered a case where wafers W having, for example, different surface states are processed by using the single liquid processing unit 16A and the single supercritical drying processing unit 16B. In this case, it may be considered to change the amount of the protection liquid (thickness of the protective film) depending on the surface state. Since the volatilization amount of the protection liquid may be different if the surface states of the wafers W are different, the adjustment of the transfer time and/or the adjustment of the initial liquid film thickness may be performed based on the surface states of the wafers W. Furthermore, it may be considered to use protection liquids having different volatility for the wafers W in the single liquid processing unit 16A and the single supercritical drying processing unit 16B. In this case, since the volatilization amount of the protection liquid changes during the transfer of the wafer W, the adjustment of the transfer time and/or the adjustment of the initial liquid film thickness may be performed based on the different volatility of the protection liquids.

Furthermore, there may be considered a case where there is a temperature distribution in the transfer space 15A, and, in this case, the volatilization amount of the protection liquid may vary for each transfer path due to this temperature distribution. The adjustment of the transfer time and/or the adjustment of the initial liquid film thickness may be performed to compensate the non-uniformity in the volatilization amount between the transfer paths which is caused by the temperature distribution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
multiple liquid film forming units configured to form a liquid film of a protection liquid on a surface of a substrate;
multiple drying processing units configured to accommodate therein the substrate on which the liquid film is formed to dry the substrate;
a substrate transfer device configured to take out the substrate on which the liquid film is formed to a transfer space from one liquid film forming unit selected from the multiple liquid film forming units and transfer the taken substrate from the transfer space into one drying processing unit selected from the multiple drying processing units;
an air flow forming unit configured to form an air flow within the transfer space by discharging a gas into the transfer space; and
a control device configured to control a thickness of the liquid film on the surface of the substrate at a moment when a drying processing is begun in the selected one drying processing unit to fall within a target range by performing a transfer time adjusting operation of adjusting a volatilization amount of a liquid forming the liquid film on the surface of the substrate during a transfer of the substrate by adjusting a transfer time during which the substrate is transferred from the selected one liquid film forming unit into the selected one drying processing unit with the substrate transfer device,
wherein the control device is further configured to perform the transfer time adjusting operation based on a flow velocity of the air flow formed, by the air flow forming unit, in a transfer path through which the substrate passes when the substrate is transferred from the selected one liquid film forming unit into the selected one drying processing unit by the substrate transfer device.

2. The substrate processing apparatus of claim 1, further comprising:
a housing configured to accommodate therein the multiple liquid film forming units, the multiple drying processing units and the substrate transfer device,
wherein the transfer space is provided within the housing, and the transfer substrate device is accommodated and the transfer of the substrate is performed between the multiple liquid processing units and the multiple drying processing units by the substrate transfer device.

3. A substrate processing method performed in a substrate processing apparatus including multiple liquid film forming units configured to form a liquid film of a protection liquid on a surface of a substrate; multiple drying processing units configured to accommodate therein the substrate on which the liquid film is formed to dry the substrate; and a substrate transfer device configured to take out the substrate on which the liquid film is formed from one liquid film forming unit selected from the multiple liquid film forming units and transfer the taken substrate into one drying processing unit selected from the multiple drying processing units, the substrate processing method comprising:
forming the liquid film of the protection liquid on the surface of the substrate in the selected one liquid film forming unit;
transferring the substrate to a transfer space from the selected one liquid film forming unit by the substrate transfer device;
discharging a gas into the transfer space by an air flow forming unit to form an air flow within the transfer space;
transferring the substrate from the transfer space into the selected one drying processing unit by the substrate transfer device;
drying the substrate in the selected one drying processing unit; and
controlling a thickness of the liquid film on the surface of the substrate at a moment when a drying processing is begun in the selected one drying processing unit to fall within a target range, by performing a transfer time adjusting operation of adjusting a volatilization amount of a liquid forming the liquid film on the surface of the substrate during a transfer of the substrate by adjusting a transfer time during which the substrate is transferred from the selected one liquid film forming unit into the selected one drying processing unit with the substrate transfer device, and
the transfer time adjusting operation is performed based on a flow velocity of the air flow formed, by the air flow forming unit, in a transfer path through which the substrate passes when the substrate is transferred from the selected one liquid film forming unit into the selected one drying processing unit by the substrate transfer device.

4. The substrate processing method of claim 3,
wherein the substrate processing apparatus further comprises a housing configured to accommodate therein the multiple liquid film forming units, the multiple drying processing units and the substrate transfer device,
the transfer space, in which the substrate transfer device is accommodated and the transfer of the substrate is performed between the multiple liquid processing units and the multiple drying processing units by the substrate transfer device, is provided within the housing.

5. The substrate processing method of claim 3,
wherein the controlling of the thickness of the liquid film is performed by a combination of the transfer time adjusting operation and an initial liquid film thickness adjusting operation of adjusting the thickness of the liquid film formed on the surface of the substrate in the selected one liquid film forming unit.

6. A computer-readable recording medium having stored thereon computer-executable instructions that, in response to execution, cause a substrate processing apparatus to perform a substrate processing method as claimed in claim 3.

* * * * *